(12) United States Patent
Miller et al.

(10) Patent No.: US 6,660,375 B1
(45) Date of Patent: Dec. 9, 2003

(54) LOW TEMPERATURE CHEMICAL VAPOR DEPOSITION OF THIN FILM MAGNETS

(75) Inventors: Joel S. Miller, Salt Lake City, UT (US); Kostyantyn I. Pokhodnya, Salt Lake City, UT (US)

(73) Assignee: University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 10/089,480

(22) PCT Filed: Oct. 26, 2000

(86) PCT No.: PCT/US00/29517

§ 371 (c)(1),
(2), (4) Date: Nov. 27, 2002

(87) PCT Pub. No.: WO01/30511

PCT Pub. Date: May 3, 2001

Related U.S. Application Data

(60) Provisional application No. 60/161,380, filed on Oct. 26, 1999.

(51) Int. Cl.[7] .................................................. B32B 5/16
(52) U.S. Cl. ...................... 428/336; 427/127; 427/128; 427/255.29; 427/294; 427/295; 428/422; 428/432; 428/457; 428/473.5; 428/545; 428/611; 428/639; 428/650; 428/660; 428/662; 428/663; 428/668; 428/692; 428/693; 428/900; 428/920

(58) Field of Search .................................. 427/127, 128, 427/255.29, 294, 295; 428/336, 422, 432, 457, 473.5, 545, 611, 639, 650, 660, 662, 663, 668, 692, 693, 900, 920

(56) References Cited

U.S. PATENT DOCUMENTS 4,339,508 A  7/1982  Tsuya et al.

*Primary Examiner*—Bernard Pianalto
(74) *Attorney, Agent, or Firm*—TraskBritt

(57) ABSTRACT

A thin-film magnet formed from a gas-phase reaction of tetracyanoetheylene (TCNE) OR (TCNQ), 7,7,8,8-tetracyano-P-quinodimethane, and a vanadium-containing compound such as vanadium hexcarbonyl ($V(CO)_6$) and bis(benzene)vanalium ($V(C_6H_6)_2$) and a process of forming a magnetic thin film upon at least one substrate by chemical vapor deposition (CVD) at a process temperature not exceeding approximately 90° C. and in the absence of a solvent. The magnetic thin film is particularly suitable for being disposed upon rigid or flexible substrates at temperatures in the range of 40° C. and 70° C. The present invention exhibits air-stable characteristics and qualities and is particularly suitable for providing being disposed upon a wide variety of substrates.

48 Claims, 6 Drawing Sheets

LOW TEMPERATURE CHEMICAL VAPOR DEPOSITION OF THIN FILM MAGNETS

CROSS REFERENCE TO RELATED APPLICATION

This application claims the benefit of U.S. Provisional Application No. 60/161,380, filed Oct. 26, 1999.

TECHNICAL FIELD

The present invention relates generally to thin-film magnets, or magnetic thin films, and more specifically relates to the composition of magnetic thin films produced from the reaction of a vanadium containing compound, tetracyanoethylene and a low-temperature chemical vapor deposition processes for depositing a vanadium containing thin-film upon a wide variety of supporting substrates.

BACKGROUND ART

Thin films having certain magnetic, electrical, optical properties, low temperature processibility, insulating to semiconducting behavior, mechanical flexibility, solubility, and substrate compatibility properties, as well as other physical properties, are of interest and often times are essential in many applications. Of particular interest are magnetic thin films that may be deposited upon substrates comprised of materials such as plastics, glasses, metals, and ionic crystalline materials and in which the substrates are either rigid or flexible. For example, thin magnetic films are used extensively on magnetic tapes and media used in the storage and retrieval of computer generated data, magnetic shielding, as well as for providing extraction of magnetic substances.

The use of chemical vapor deposition (CVD) techniques for applying various thin films onto a variety of substrates is generally well known. For example, CVD is used extensively in the semiconductor industry to apply thin films having various electrical and magnetic characteristics onto substrates constructed primarily or entirely of semiconductive material containing silicon, germanium, or gallium arsenide and other generally inorganic substrates. Normally CVD techniques used in the semiconductor industry are conducted at temperatures above 200° C.

Many advances in the art of producing magnetic materials, including molecule-based magnetic materials have occurred in the past decade. An example of synthesizing such a molecule-based magnetic material, or magnet, includes reacting tetracyanoethylene (TCNE) in a solution of bis(benzene)vanadium, $V(C_6H_6)_2$, or vanadium hexacarbonyl $V(CO)_6$ in the presence of an aprotic poorly coordinating solvent such as acetonitrile, $C_2H_3N$, tetrahydrofiran, $C_4H_8O$ or dichloromethane, $CH_2Cl_2$, at or below room temperature. Such priorly known solvent-based reaction can be symbolically stated: $V[TCNE]_x \cdot S$ wherein $T_c$ is~400 K; x~2; y~0.5; and S≈solvent as set forth in: Manriquez, J. M.; Yee, G. T.; McLean, R. S.; Epstein, A. J.; Miller, J. S., Science 1991, 252, 1415; and Miller, J. S.; Yee, G. T.; Manriquez, J. M.; Epstein, A. J., in the Proceedings of Nobel Symposium #NS-81 *Conjugated Polymers and Related Materials: The Interconnection of Chemical and Electronic Structure*, Oxford University Press, 1993, 461 with respect to reacting bis(benzene)vanadium, $V(C_6H_6)_2$, in a solvent and as set forth in Zhang, J.; Zhou, P.; Brinckerhoff, W. B.; Epstein, A. J.; Vazquez, C.; McLean, R. S.; Miller, J. S., A. C. S. Sym. Ser. 1996, 644, 311 with respect to reacting vanadium hexacarbonyl $V(CO)_6$ in a solvent. Such molecule based magnets, or magnetic thin films, synthesized in the presence of a solvent are extremely air sensitive, do not magnetically saturate at lower temperatures, and tend to have an inhomogeneous compositions and non-uniform densities and poorly reproducible magnetic properties. Moreover, molecule based magnets, or magnetic thin films, produced in the presence of a solvent in accordance with priorly known techniques, also tend to decompose at the diffusion rate of oxygen (sometimes in a pyrophoric manner) thus giving rise to a constant concern of oxygen contamination.

It is also known that thin-film magnets produced in the presence of a solvent are very prone to having undesirably modulated magnetic properties due to coordination to the metal ion thereby blocking spin-coupling pathways and creating structural disorder and thus suppressing the film's magnetic ordering temperature, $T_c$. Additionally, solvent synthesized magnetic films tend to be pyrophoric.

DISCLOSURE OF INVENTION

A low temperature (25–90° C.) CVD based process in accordance with the present invention enables the fabrication of thin-film magnets on a variety of rigid and flexible substrates in the absence of a solvent such as acetonitrile, $C_2H_3N$, tetrahydrofiran, $C_4H_8O$, or dichloromethane, $CH_2Cl_2$, etc. Thin-film polymeric magnets of the present invention have enhanced air stability as well as other more favorable characteristics with respect to related magnets prepared from solution and containing solvent. Thus, the present invention provides the opportunity to prepare a broad range of magnetic structures, e.g., patterned and multilayered. Representative substrates in which the thin-film polymeric magnets of the present invention may be disposed upon include, but are not limited to, substrates comprised of alkali halides, e.g., sodium chloride (NaCl), potassium bromide (KBr) and cesium iodide ($C_sI$), plastics/polymers including polytetrafluorethylene (PTFE), polyethylene teraphthalate (PET), and nylons, various crystalline and non-crystalline materials such as glasses, glass-ceramics, and ceramics, mica, semiconductive materials including gallium arsenide, silicon, and geranium, as well as metals such as aluminum, nickel, and alloys comprising aluminum-nickel including alnico magnets to name just a few of suitable materials. The thickness of the film may range to at least approximately 25 microns (25 μm) with thicknesses ranging from approximately 20 nanometers (20 nm) to approximately 10 microns (10 μm) being especially suitable for many applications.

Thin-film polymeric magnets embodying compositions and synthesized in accordance with the present invention are essential for many applications and the diverse new class of organic magnets are ideally suited for their development due to magnetic ordering temperatures, $T_c$, well above room temperature, modulation/tuning of properties via organic chemistry methodologies, compatibility with polymers for composites, mechanical flexibility, transparency, low temperature processibility, insulating to semiconducting behavior, solubility, etc. The present invention includes a method of synthesizing thin-film magnets composed of $V[TCNE]_x$ by a gas-phase chemical vapor deposition (CVD) process that is conducted at relatively low temperatures ranging from 25–90° C. and at pressures ranging from 1–50 Torr, or greater. With respect to suitable gases to use in the CVD process, argon is particularly suitable and is constantly provided at rate to maintain the selected process pressure. However, nitrogen, helium, and carbon dioxide may be used in the CVD process as well as any of the chemically inert noble gases. During the CVD process, a flow rate of TCNE through an exemplary CVD apparatus, as disclosed herein, ranges from approximately 100 to 350 standard cubic centimeter per minute (100–350 sccm/min) with approximately 250 sccm/min being generally suitable for process pressures levels in the 1–50 Torr. The ratio of TCNE gas to V(CO)$_6$ gas preferably ranges from 3:1 to 2:1. The CVD process is continued until the depth of the film on the selected substrate has been obtained. Whereupon the process is discontinued and the newly formed thin-film magnet, disposed on a selected substrate, is removed from the CVD apparatus. The thin-film magnet may then optionally be annealed at an elevated temperature (T>350K) for a selected amount of time to alter the magnetic characteristics of the magnet if desired.

Alternately, rather than use TCNE, TCNQ may be used.

Optionally, bis(benzene)vanadium, V(C$_6$H$_6$)$_2$, may be used as the vanadium containing process gas in lieu of V(CO)$_6$ if desired.

Furthermore a suitable compositional make up of the magnetic thin film V[TCNE]$_x$, where x=1.35 to 2, of the present invention is disclosed and is further defined and made identifiable in terms of magnetic, electrical, optical, and other defining characteristics. Such other defining characteristics include saturation magnetization properties ranging from approximately 10 emuOe/g to approximately 30 emuOe/g with electrical conductivity ranging from approximately 10$^{-5}$ S/cm to approximately 10$^{-4}$ S/cm.

BEST MODE FOR CARRYING OUT THE INVENTION

Figure 1:
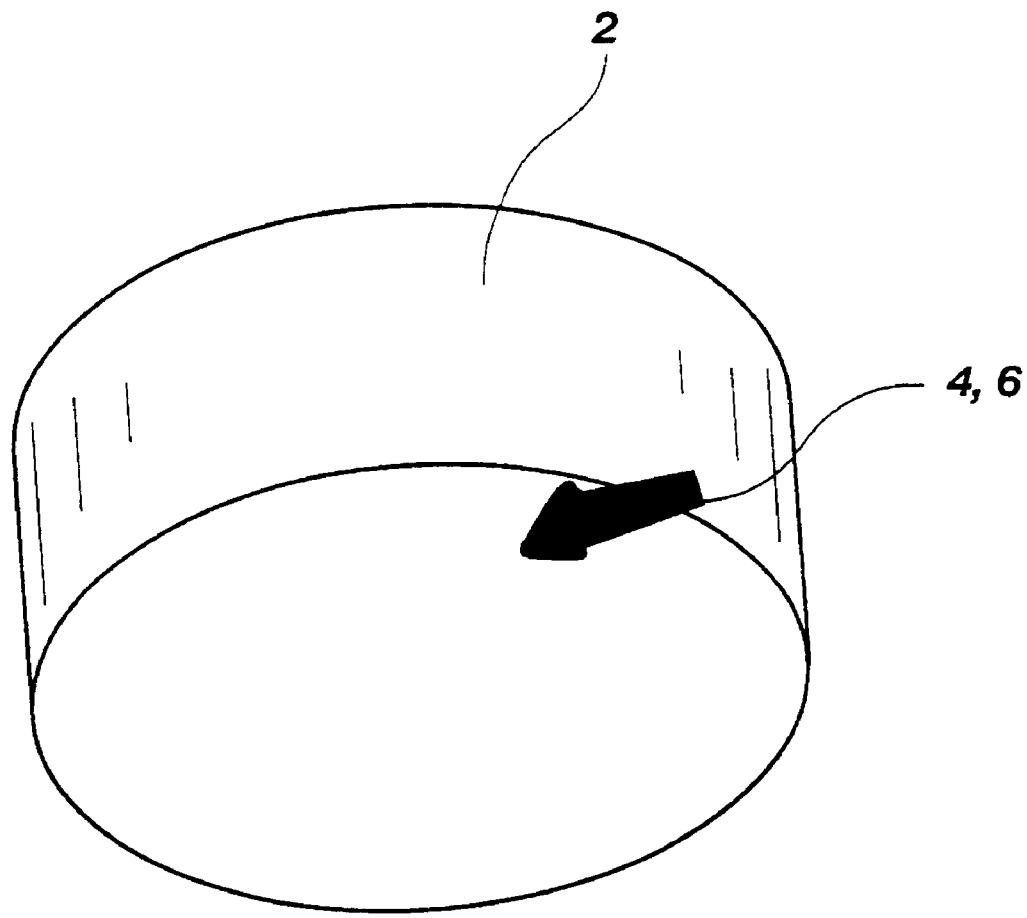
FIG. 1 is a photograph of approximately a 5 μm coating of the V[TCNE]$_x$ magnetic thin film on a glass cover slide being attracted to a Co$_5$Sm magnet at room temperature in the air.

The present invention includes an exemplary CVD method especially suitable for forming thin films having magnetic characteristics suitable for a wide variety of applications, as well as to eliminate the deleterious effect of C$_2$H$_3$N, C$_4$H$_8$O, and CH$_2$Cl$_2$, etc., being used as solvents which were believed to be required in the process of forming vanadium based magnetic materials. In accordance with the present invention V[TCNE]$_x$ films are rendered from the gas phase reaction of TCNE and V(CO)$_6$ in the absence of effective solvents such as C$_2$H$_3$N, C$_4$H$_8$O, CH$_2$Cl$_2$, etc. Thin-film magnets embodying the present invention are easily deposited on, for example, glass, quartz, mica, polytetrafluorethylene, alkali metal halides, e.g., NaCl and CsI, gold, silver, aluminum, Si wafer, amorphous carbon, etc., such as described herein. Typical thicknesses, as measured by optical microscopy, of films on glass substrates after deposition for 12 hours are typically 1–5 μm depending upon the distance from the TCNE and V(CO)$_6$ reaction zone. However, films in accordance with the present invention may range from 10 nm to upward of 25 μm in thickness. A thickness range of approximately 2 μm to approximately 10 μm will likely be particularly suitable for many applications which will provide a thin-film magnet or magnetic coating having uniform and stable characteristics. It should be understood that in some instances the thickness may be thinner or thicker. Such substrate-supported thin-film magnets exhibit sufficient magnetic qualities at room temperature to be attracted to a magnet, as can be viewed in FIG. 1. Unlike solvent prepared V[TCNE]$_x$·yS, which decomposes at the diffusion rate of oxygen (sometimes in a pyrophoric manner), the present V[TCNE]$_x$ films are relatively air stable and can be handled in air as evidenced by FIG. 1.

Figure 6:
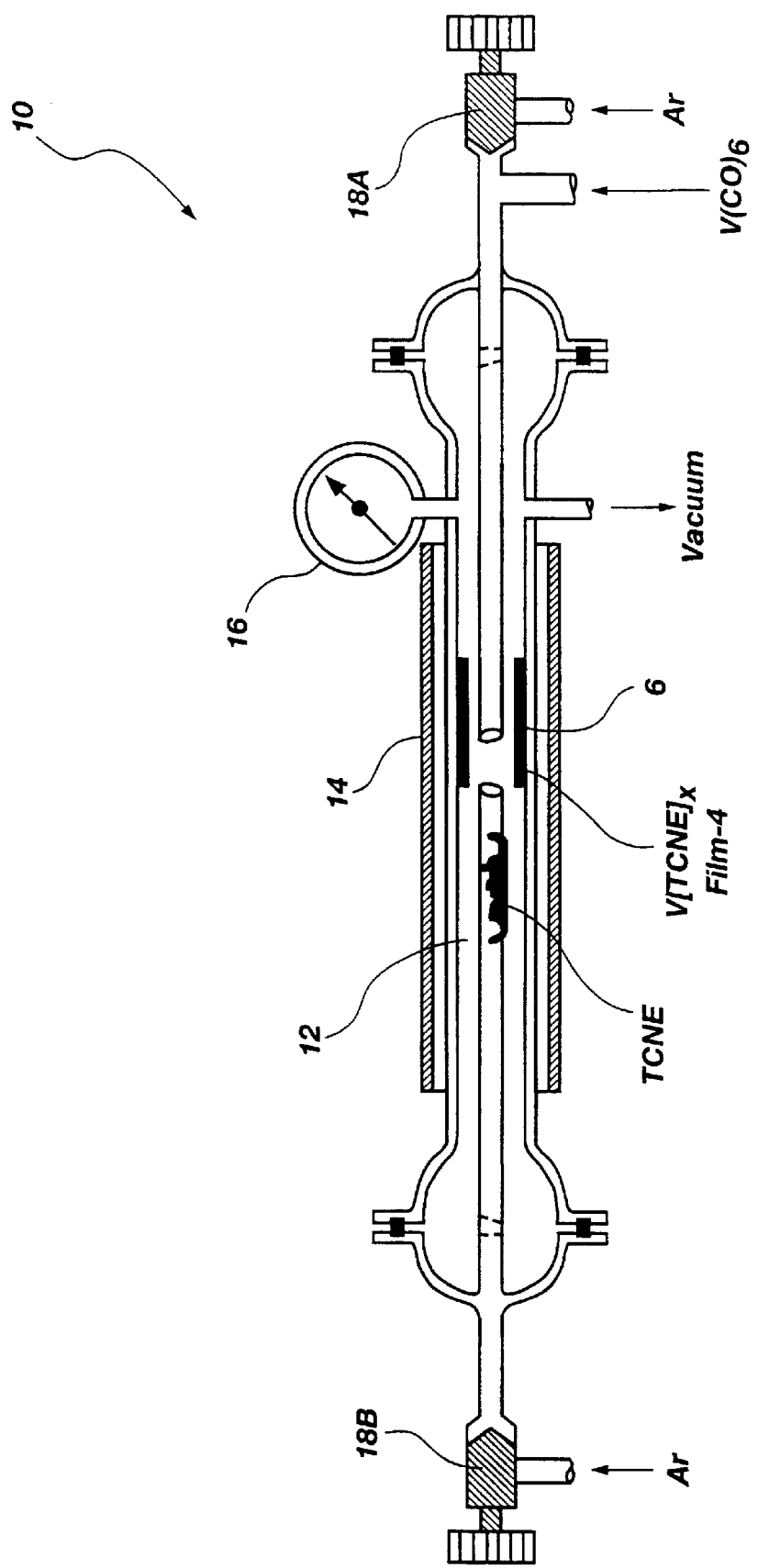
FIG. 6 is a schematic illustration of an exemplary CVD apparatus that may be used to synthesize thin-film magnets comprised of V[TCNE]$_x$ in accordance with the present invention.

A schematic of a representative gas-transport reactor, also referred to as a CVD apparatus 10, that is particularly suitable for reacting TCNE and V(CO)$_6$ in order to render a thin-film magnet 4 onto a preselected substrate 6 is depicted in FIG. 6 of the drawings. CVD apparatus 10 includes a hermetically enclosed reaction/processing chamber 12 encircled by a thermal heating device such as, but not limited to, electrically resistive heating element 14. A gauge 16, or other monitoring instrumentation is provided to allow the monitoring of the processing pressure within the reaction chamber of the apparatus when in operation.

The operation procedure of apparatus 10 generally includes placing a suitable substrate 6 in chamber 12 and loading a preselected amount of TCNE within a glass boat preferably provided within chamber 12. Preferably the TCNE is in crystal form and has been purged with: argon gas three times to ensure purity. The amount of TCNE to be loaded will of course depend on the scale of the reaction to take place.

A supply of V(CO)$_6$ vapor is introduced in a controlled manner and installed on the right side of apparatus 10, the "V(CO)$_6$ side", with the TCNE positioned opposite thereof, the "TCNE side", as shown in FIG. 6. The desired V(CO)$_6$ pressure may be obtained by the use of a Peltier cooler (not shown) or any other apparatus known within the art to provide a source of V(CO)$_6$ vapor of sufficient quantity to meet the stoichiometric demand of the reaction process to be conducted. Preferably the resulting V[TCNE]$_x$ magnetic thin film 4 will have a value of x ranging between 1.35 to 2.0 with a value of 1.5 to 1.8; being most easily obtained while providing a magnetic thin film 4 having characteristics suitable for a wide range of applications.

The supply temperature of the $V(CO)_6$ is preferably about −10° C. to 0° C. Reaction chamber 12 is evacuated by slowly drawing a vacuum until a preferred pressure of approximately 10 Torr is obtained. Other evacuation pressures ranging upward of 50 Torr may be used, but generally the higher the evacuation pressure, the slower the deposition rate of the $V[TCNE]_x$ magnetic thin-film 4 eventually to be disposed upon substrate 6.

Argon metering valve 18A is adjusted to allow argon (Ar) to flow into chamber 12 from the TCNE side at a preferred flow rate of approximately 250 sccm/min. The flow rate need not be exactly 250 sccm/min but may range from 100 to 350 sccm/min, for example, with negligible or no adverse affects on the process. Heating device 14 is activated to maintain a preferred reaction zone temperature of approximately 50° C., i.e. 40 to 60° C. The temperature profile of the heating device was adjusted to achieve the temperature of TCNE supply to about 50° C. However the chamber temperature may range anywhere from 25 to 90° C. with the optimum temperature likely to be selected in light of the temperature sensitivity of the material of substrate 6.

Upon selecting and stabilizing the Ar flow rate into chamber 12 from the TCNE side of the apparatus, the temperature of the $V(CO)_6$ was raised up to the range of 0° C. to 15° C. and a controlled amount of $V(CO)_6$, vapor mixed with argon, is allowed to enter chamber 12 at a preselected flow rate. This is achieved by allowing the supply of $V(CO)_6$ to be in communication with chamber 12 and opening and adjusting Ar metering valve 18A on the $V(CO)_6$ side of the apparatus thereby allowing $V(CO)_6$ to be carried into chamber 12. Preferably the flow rate of Ar downstream of metering valve 18A is approximately ⅓ to ½ the flow rate of the Ar being introduced on the TCNE side of the apparatus. That is, if the Ar flow rate downstream of Ar metering valve 18B is approximately 250 sccm/min, the flow rate of $Ar/V(CO)_6$ downstream of Ar metering valve 18A will preferably be approximately 80 to 130 sccm/min. However, the temperature of the argon is not critical and can be varied within a range from about 10° C. to about 25° C. with generally no adverse effects and under certain circumstances the temperature may fall outside of this range with no, or negligible effects. The process pressure within chamber 12 is modulated to take into account the respective partial pressures.

The TCNE and the $V(CO)_6$ is allowed to react for a sufficient amount of time to render a $V[TCNE]_x$ film 4 on substrate 6 of a desired thickness. A deposition rate of approximately 0.2 μm/hour depending on respective Ar flow rates, quantity of $V(CO)_6$ vapor supplied, quantity of TCNE vapor supplied, and the various supply temperatures and process temperature and pressure. Generally speaking, providing an abundance of TCNE over the calculated stoichiometric minimum amount of TCNE needed for the reaction will increase the deposition rate with little or no negative side effects.

Upon the resulting film 4 reaching a selected thickness, the process is terminated in generally the reverse order and the $V[TCNE]_x$ film 4 on substrate 6 is removed from apparatus 10. If desired the resulting thin film magnet may be annealed as described herein below in order to optimize certain physical characteristics thereof.

Figure 2B:
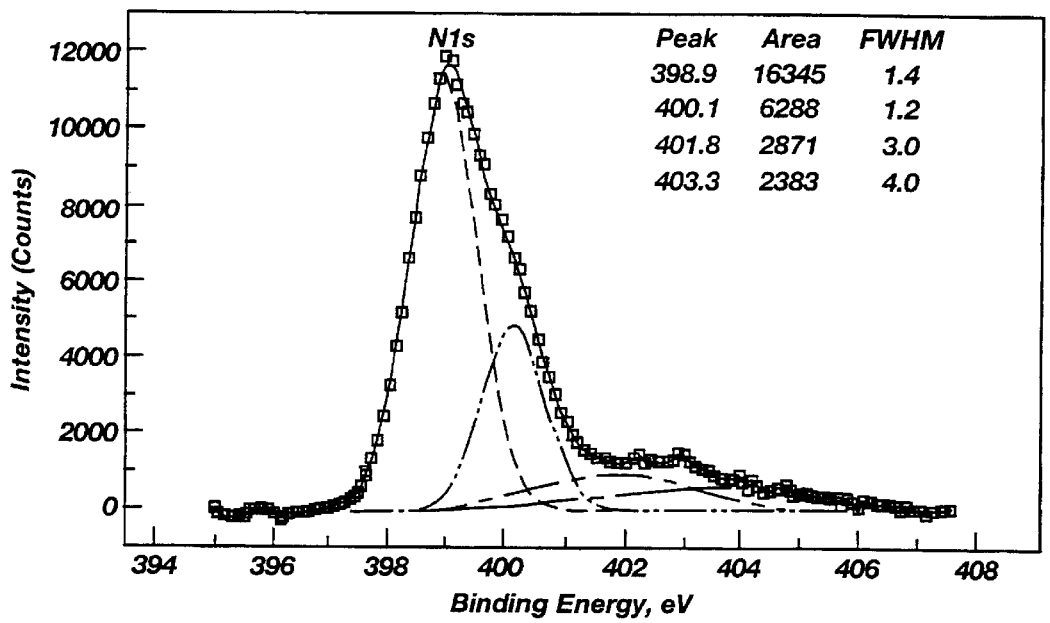
FIG. 2B is a XPS spectrum of N 1s electrons taken from the surface of V[TCNE]$_x$ magnetic thin film deposited upon a glass substrate (the respective peak-fit parameters are presented as an inset) in accordance with the present invention.
Figure 2A:
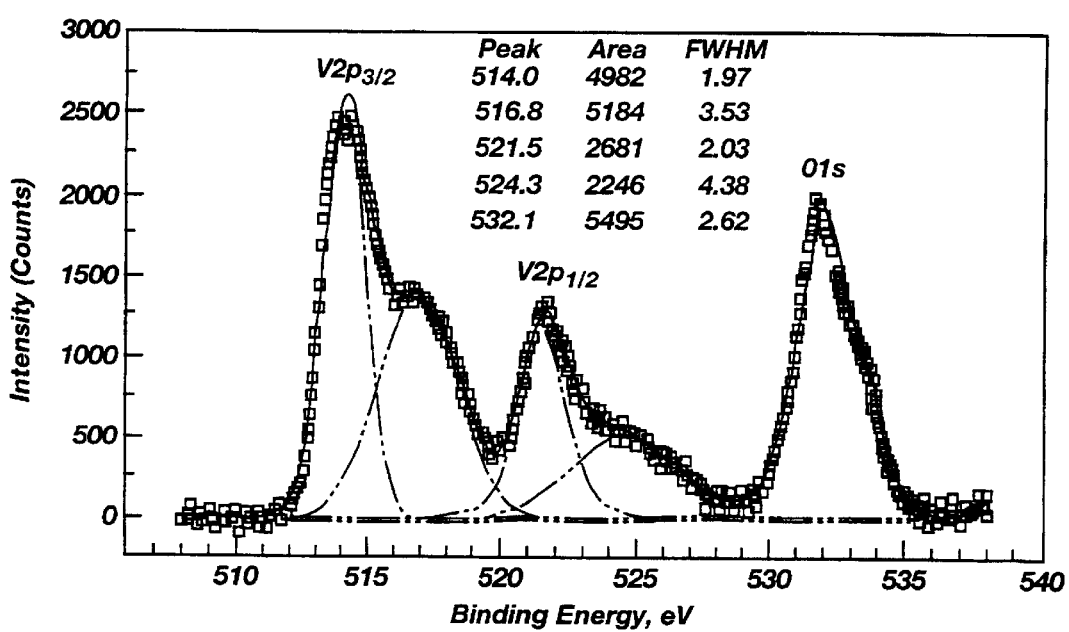
FIG. 2A is an X-ray photoelectron spectrum (XPS) of V 2p and O 1s electrons.

X-Ray photoelectron spectroscopic (XPS) surface analyses shown in FIGS. 2A and 2B, reveal a film composition for a sample of $VC_{16.9}N_{8.8}O_{1.1}$ in reasonable agreement with $V[TCNE]_2$ ($VC_{12}N_8$). The oxygen is attributed to surface oxidation, and the high carbon content is attributed to adventitious carbon. The N:V ratio is 8.77, close to 8 expected for $V[TCNE]_2$.

Referring now to FIGS. 2A and 2B wherein the Vanadium 2p spectra show that the $V2p_{3/2}$ and $V2p_{1/2}$ lines are split into two components at 514.0, 516.8, 521.5, and 524.3 eV representing both low and high oxidation states of vanadium ion, see FIG. 2A. The 514.0 and 521.5 eV peaks are characteristic of $V^{II}$, while the 516.8 and 524.3 eV peaks correspond to $V^V_2O_5$, that is attributed to surface oxidation. The corresponding O1s peak is at 532.1 eV, FIG. 2A. The best fit to experimental data was obtained for purely Gaussian peaks, implying a distribution of binding energies arising from a distribution of V coordination environments. This is consistent with preliminary powder X-ray diffraction data and transmission electron micrographs that reveal that $V[TCNE]_x$ films are amorphous.

The 399.0 eV N 1s peak is asymmetric and has a weak, high-energy satellite, assigned to a shake-up process as shown in FIG. 2B. A Gaussian deconvolution of the main peak reveals two components (∼2:1) at 398.9 and 400.0 eV. The former coincides with the N1s peak in [MnTPP][TCNE] (398.9 eV), for which [TCNE] has two unbonded N's and two $Mn^{III}$- bonded N's, as well as four pyrrole N's. The intensity of the 400.0 eV peak strongly increases upon air exposure and is assigned to TCNE°, the oxidation product of [TCNE].

It should be understood that a representative sample of the thin-film composition of the present invention is illustrated in drawing FIGS. 2A and 2B and other representative samples of the thin-film composition of the present invention having impurities therein may have other characteristics than those illustrated.

Figure 4B:
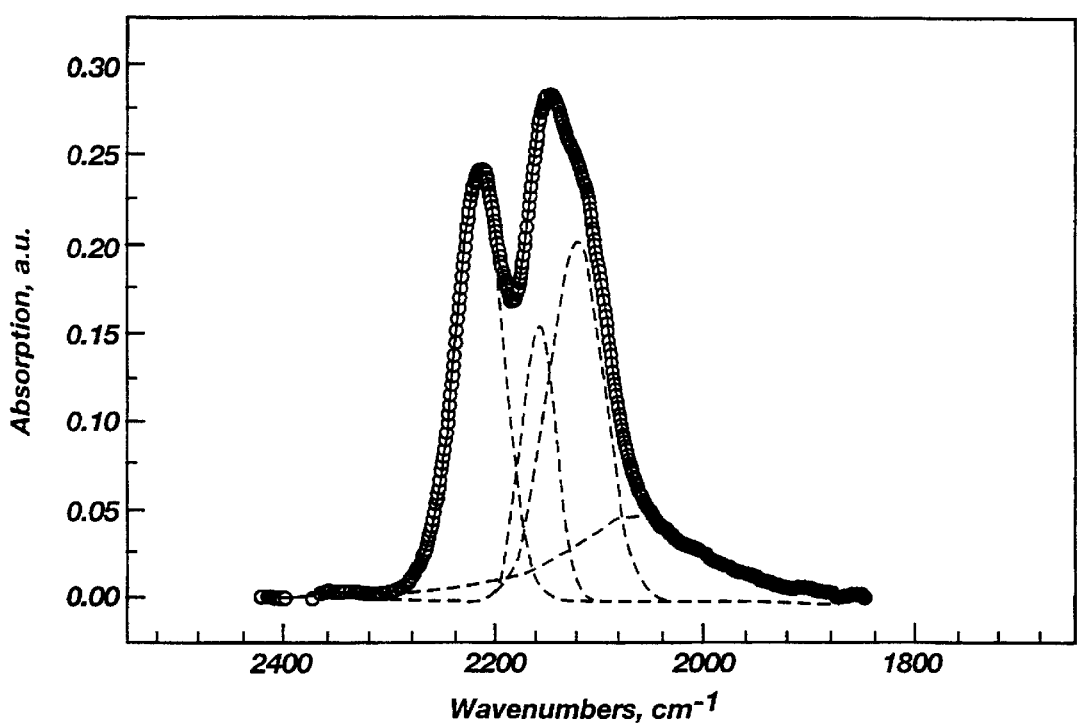
FIGS. 4A and 4B are IR absorption spectra of V[TCNE]$_x$ film deposited on a sodium chloride (NaCl) plate in the region of υ$_{CN}$ stretching vibrations, FIG. 4A reveals the absorption spectra before annealing at 400K and FIG. 4B reveals the absorption spectra after 20 minutes of annealing at 400K (respective peak-fit parameters are presented as an inset)
Figure 4A:
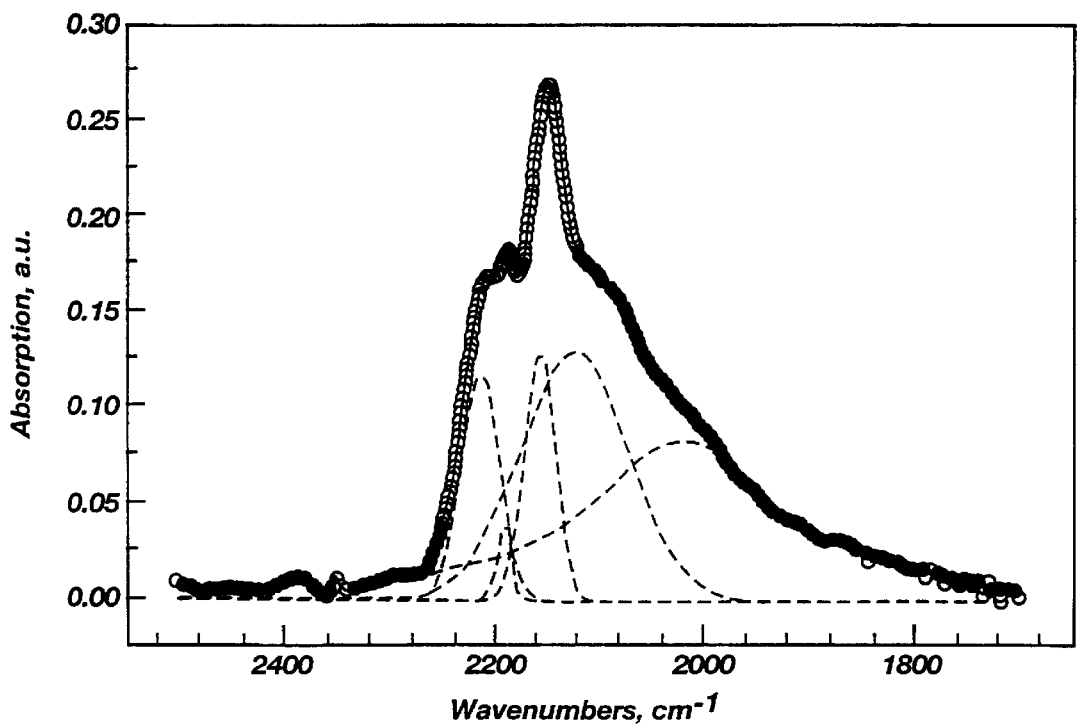

After about 1 hour of air exposure the $V^{II}$ peaks are still clearly distinguishable, but attenuated ($V^{II}:V^{IV}::1:10$), implying that air oxidation of the films is significantly slower than that reported for bulk material prepared from solution as illustrated in FIG. 4A.

The temperature dependence of the magnetization, M(T), of a $V[TCNE]_x$ film scraped from a glass substrate shows magnetic ordering with a 400K extrapolated $T_c$. The field dependence of the magnetization, M(H), reveals hysteresis with a small coercive field of approximately 4.5 Oe at 300 K, which increases to 7 Oe on cooling to 5K. Hence, $V[TCNE]_x$ filins of the present invention are magnetically soft, in accord with its amorphous nature. As can be seen in plot-a of FIG. 3, the 5K M(H) almost saturates to 18 emuOe/g at 500 Oe, in accord with one spin per [TCNE] antiferromagnetically coupled to the $S=3/2$ $V^{II}$, ie., $S_{tot}=3/2−2(½)=½$, and the expectation of 18.2 emuOe/g for an ideal material of $V[TCNE]_2$ composition.

Again, such characteristics of a thin-film composition of the present invention may vary depending upon the impurities therein.

The temperature dependent remanent magnetization plot (b) of FIG. 3, $M_r(T)$, indicates magnetic ordering below 370K. Below 100K, $M_r(T)$ decreases almost linearly with decreasing T similar to that reported for $V[TCNE]_x \cdot yCH_2Cl_2$, suggesting strong fluctuations in the magnetic exchange value and magnetic anisotropy, typical of amorphous and strongly disordered materials. In contrast to solvent-prepared $V[TCNE]_x \cdot yS$, $M_r(T)$ does not show a tendency to saturate at low temperatures. A rapid drop in $M_r(T)$ was observed on cooling at 2 to 5K. Similar remanent magnetizations have been reported for amorphous ferrites, in which it was attributed to a random distribution in the strength of the superexchange interaction due to a structural disorder.

Figure 3:
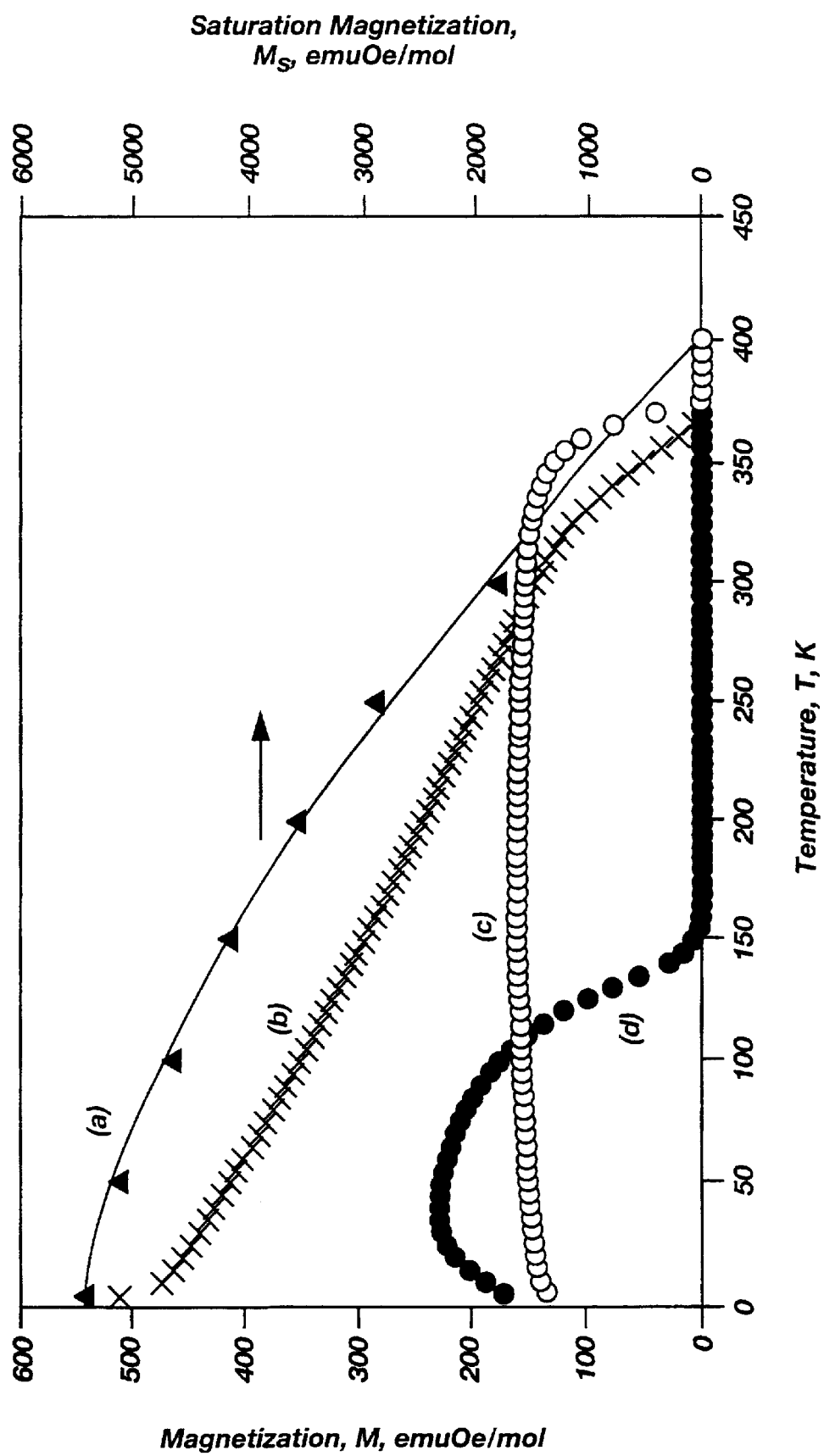
FIG. 3 is shown as (a) is the saturation magnetization verses temperature, M$_S$, data (▼) and the fit to Spin Wave Theory (SWT) (solid line); (b) is the remanent magnetization of V[TCNE]$_x$ film scraped from the glass substrate [cooled to 2K in a 500 Oe applied field, then the applied magnetic field was reduced to zero and M(T) was monitored on warming up to 400K]; (c) is the zero field cooled magnetization of another V[TCNE]$_x$ sample measured upon warming from 4 to 400K at 3 Oe applied magnetic field; and (d) is the magnetization measured at 3 Oe magnetic field on cooling after 20 minutes of annealing at 400K.

The M(T) dependence is very different at a small (about 3 Oe) external magnetic field, see plot (c) of FIG. 3. This is attributed to the field being insufficient to align all spins and the magnetization below $T_c$ is only 5% of saturation value suggesting the existence of a substartial transverse component due to a random anisotropy. By increasing the external field this component can be considerably suppressed and above 500 Oe the spins are almost fully aligned resembling the behavior of a wandering axis ferrimagnet.

The saturation magnetization temperature dependence, $M_s(T)$, plot (a) of FIG. 3, can be fit to the Bloch law, $M_s(T)=M_s(0)(1-BT^{3/2})$, of the spin wave theory (SWT) with $M_s(0)=18$ emuOe/g, $B=1.2\times10^{-4}$ $K^{3/2}$ and an extrapolated $T_c$ of 400K in excellent agreement with $T_c$'s of solution-prepared $V[TCNE]_x \cdot yS$. For a specific sample, related values are expected for related samples. Using $B=0.0587(k_B/2JS_{tot}$ for a simple cubic lattice, and $S_{tot}=\frac{1}{2}$, the average exchange energy $(J/k_B)$ is approximately 100K. This is a little smaller than the value of approximately 133K obtained using mean field theory, i.e., $T_c=2JzS_{tot}(S_{tot}+1)/3k_B$ (z=number of nearest neighbors). The fit of $M_s(T)$ to the Bloch law over the entire temperature range is only typical of amorphous magnets, and is similar to that reported for $V[TCNE]_x \cdot yS$. The B-value is twenty times that for Ni implying an attenuated spin wave stiffness in $V[TCNE]_x$ with respect to conventional magnets.

The extrapolated 400K $T_c$ exceeds the experimentally observed ~370K onset of the magnetic transition. Since $V[TCNE]_x \cdot yS$ thermally decomposes, thermogravimetric analysis and differential scanning calorimetry (DSC) were undertaken on the solvent-free films. A negligible mass loss was observed upon heating to 523K (250° C.), while the DSC revealed an exothermic process above 353K (−80° C.) with an enthalpy of approximately 100 J/g. The exothermic character of this transformation and its very broad temperature range of approximately 100° C. suggests a structural rearrangement. Similar effect was observed for polymers due to a cold crystallization process. Furthermore, upon annealing at 400K (125° C.) for 20 minutes the onset of the magnetic transition is substantially reduced to 163K, as shown by plot (d) in FIG. 3. Annealed samples still have a remanent magnetization even above the apparent new magnetic transition temperature, although it is reduced by more than two orders in magnitude. Above the new magnetic transition there is a hysteresis loop with an order of magnitude greater coercive field (55±5 Oe) suggesting an enhanced anisotropy in the magnetic fraction of the annealed material. Hence, a low-energy structural rearrangement occurs in this temperature range that leads to a considerable decrease in J and $T_c$.

The infrared spectrum of a $V[TCNE]_x$ film deposited on a NaCl plate (freshly cleaved in an argon filled glove box) is dominated by $\upsilon_{CN}$ absorptions with two broad bands at ~2020 (width at half-height, w~200 $cm^{-1}$) and 2124 $cm^{-1}$ (w~120 $cm^{-1}$), and three narrow features at ~2214, ~2191, and ~2158 $cm^{-1}$, as exhibited in FIG. 4A. The lack of an absorption assignable to $\upsilon_{CC}$ (~1500–1400 $cm^{-1}$) suggests that most [TCNE]·−'s are symmetrically bound to $V^{II}$. (See FIG. 4B).

The 2214 and 2158 $cm^{-1}$ absorptions are close to that of the [TCNE]·− trans-$\mu$-N-bound to Mn, e.g., at 2192 and 2147 $cm^{-1}$ for [MnTPP][TCNE], where TPP is meso-tetraphenylprophyrin, and 2205 and 2125 $cm^{-1}$ for [Mn(C$_5$Me$_5$)(CO)$_2$][TCNE]. The presence of the additional bands suggest $\mu_4$-[TCNE]·−, as reported for [Mn(C$_5$Me$_5$)(CO)$_2$]$_4$[TCNE], and [Ru(NH$_3$)$_5$]$_4$[TCNE][PF$_6$]$_8$. The presence of cis-$\mu$ bridging may lead to additional absorptions. Although the broad 2020 $cm^{-1}$ absorption is shifted to lower energy even then compared to isolated (2140s and 2069s $cm^{-1}$), $\mu$-[TCNE]$^{2-}$ (2176m and 2097s $cm^{-1}$), and $\mu_4$-[TCNE]$^{2-}$ (2139m, 2057s) the possibility of bridging [TCNE]$^{2-}$ cannot be excluded. Its position and integral intensity vary with synthesis conditions, and samples with higher intensities have higher $T_c$'s. This low-energy band is associated with enhanced magnetic exchange and may arise from charge transfer between two adjacent ions $V^{2+}$ through [TCNE]·− yielding an anomalous shift of CN stretch, or among [TCNE]·−'s.

To elucidate the effect of annealing on $V[TCNE]_x$ films optical studies between 6500 and 40,000 $cm^{-1}$ at 300° K and 400° K were obtained. Two intense electronic absorption bands at 14,700 $cm^{-1}$ (680 nm) and 9100 $cm^{-1}$ (1100 nm) were observed in the near infrared region, plot-a of FIG. 5. Similar spectra were observed for [(C$_5$Me$_5$)(CO)$_2$Mn]$_2$[TCNE] with absorption bands at 13,930 $cm^{-1}$ (718 nm) and 8680 $cm^{-1}$ (1152 nm). The high-energy band was assigned to the metal-to-ligand charge transfer, while the low energy one was attributed to a metal-to-metal intravalence transition.

Figure 5:
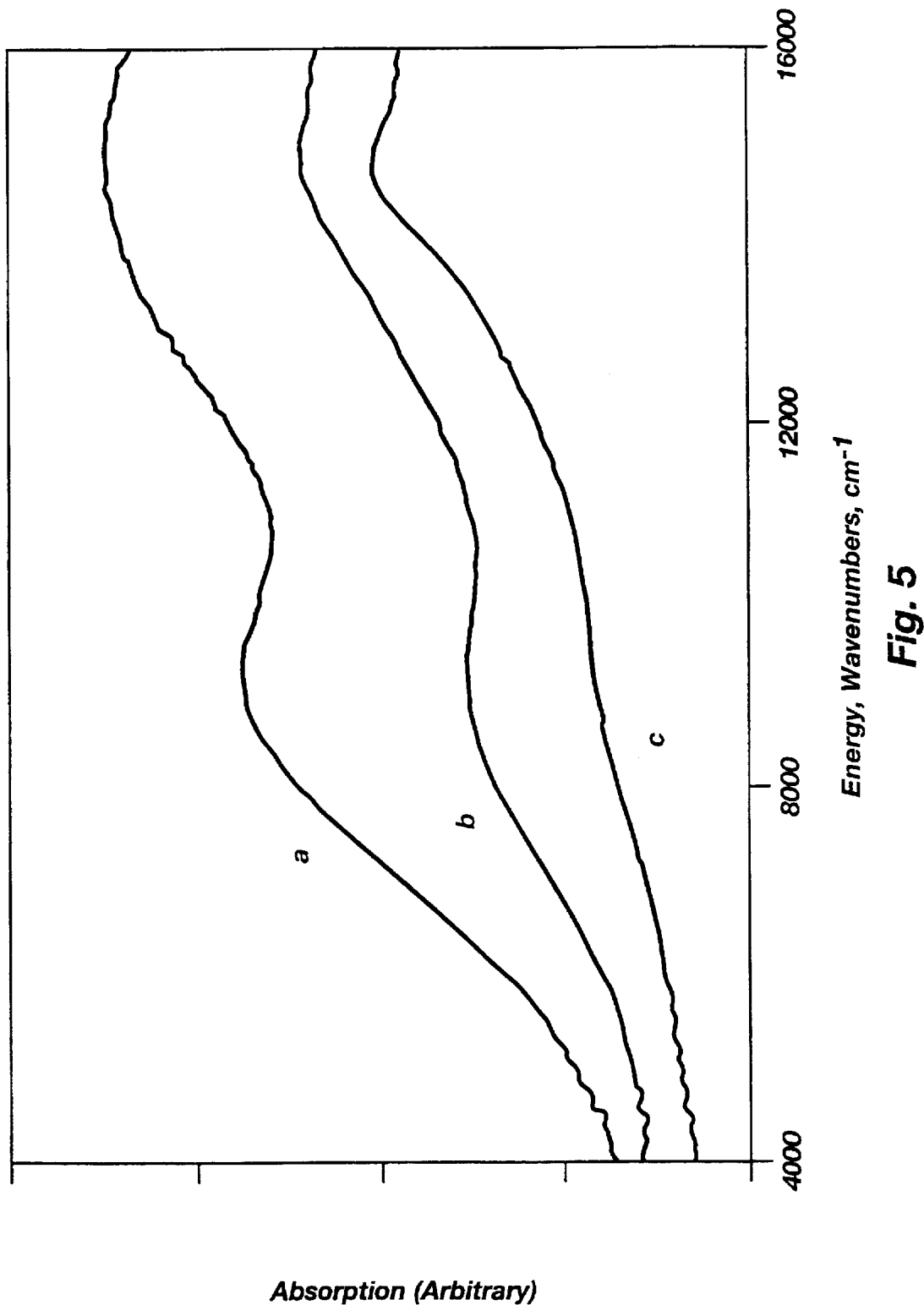
FIG. 5 is near infrared absorption spectra of V[TCNE]$_x$ film on glass before annealing at 400K (a); after 5 minutes of annealing at 400K (b); after 20 minutes of annealing at 400K (c)

Annealing of the $V[TCNE]_x$ films leads to considerable decrease of 9100 $cm^{-1}$ absorption while the 14,700 $cm^{-1}$ absorption remains relatively unchanged as per plot-b of FIG. 5. This suggests changes in the electronic structure, which may arise from structural rearrangement. Hence, using the aforementioned assignment the intravalence transition is suppressed leading to stronger localization of the [TCNE]·− electrons. Concomitantly, the IR region the intensity of the broad band at 2020 $cm^{-1}$ decreases nearly a factor of five and shifts to lower energy by ~50 $cm^{-1}$. In contrast, the most intense $\upsilon_{CN}$ bands at 2160 and 2217-$cm^{-1}$ remain unchanged, suggesting that the charge and bonding of the [TCNE]·− does not change.

The present invention provides a low-temperature chemical vapor deposition (CVD) technology, the higher temperature form of which is usually reserved for fabrication of inorganic semiconductors, can successfully be used to prepare thin films of organic magnets that strongly adhere to a wide variety of rigid and flexible substrates. Furthermore, these organic magnets degrade only slowly in air and have a magnetic transition temperature at approximately 400K. Quantitative magnetic studies together with X-ray diffraction studies lead to the conclusion that these are dense amorphous magnets with random magnetic exchange and anisotropy. Theoretical analysis yields a value of the exchange constant, $J/k_B$, of approximately 100K. A structural transformation to a different 'phase' with a lower $T_c$ occurs upon heating the sample above a temperature of 370K for extended periods.

The ability to use a low temperature processing to produce thin magnetic films on a wide variety of flexible substrates, provides the opportunity to prepare a wide range of structures, e.g., patterned and multilayered, of importance for scientific study such as the role of shape anisotropy for example, as well as for use in technological endeavors such as in the field of magnetic shielding and magnetic memories for example.

While the present invention has been described herein with respect to certain preferred embodiments, those of ordinary skill in the art will recognize and appreciate that it is not so limited and many additions, deletions, and modifications to the preferred embodiments may be made without departing from the scope of the invention as claimed. For instance, the molecule based magnetic material or magnet may be synthesized using (TCNQ), rather than (TCNE), where (TCNQ) comprises 7,7,8,8-tetracyano-P-quinodimethane. In addition, features from one embodiment may be combined with features of another embodiment while still being encompassed within the scope of the invention as contemplated by the inventors.

What is claimed is:

1. A thin film magnet formed by a gas phase reaction in the absence of a solvent, the thin film magnet comprising:
   a vanadium containing compound; and
   an organic compound.

2. The thin film magnet of claim 1, wherein the thin film magnet is deposited on a substrate.

3. The thin film magnet of claim 2, wherein the substrate comprises one of a flexible substrate and a rigid substrate.

4. The thin film magnet of claim 2, wherein the thin film magnet exhibits an infrared absorption spectra ranging from 2020 $cm^{-1}$ to 2217 $cm^{-1}$.

5. The thin film magnet of claim 2, wherein the substrate comprises one of a crystalline structure and a polymeric structure.

6. The thin film magnet of claim 2, wherein the substrate comprises at least one of the group consisting of a glass, a quartz, mica, a glass-ceramic, a ceramic, a metal, a metal alloy, alkali halide, alkaline halide, metal, alloys, intermetallic materials, magnetically hard material, magnetically soft material, aluminum-nickel, polytetrafluorethylene, a nylon, a synthetic polymer, a natural polymer and a semiconductor material.

7. The thin film magnet of claim 2, wherein the thin film has a thickness less than approximately 25 $\mu$m.

8. The thin film magnet of claim 2, wherein the thin film magnet exhibits an electrical conductivity in a range of approximately less than $10^{-5}$ S/cm to approximately $10^{-4}$ S/cm.

9. The thin film magnet of claim 2, wherein the thin film magnet exhibits an infrared absorption spectra ranging from 1950 $cm^{-1}$ to 2250 $cm^{-1}$.

10. The thin film magnet of claim 2, wherein the vanadium containing compound comprises one of vanadium hexacarbonyl, $V(CO)_6$, and bis(benzene)vanadium, $V(C_6H_6)_2$.

11. The thin film magnet of claim 10, wherein the organic compound comprises tetracyanoethylene $(TCNE)_x$.

12. The thin film magnet of claim 11, wherein x ranges from approximately 1.5 to approximately 1.8.

13. The thin film magnet of claim 10, wherein the organic compound comprises TCNQ.

14. The thin film magnet of claim 10, wherein the organic compound comprises one of TCNE and TCNQ.

15. The thin film magnet of claim 10, wherein the organic compound comprises one of TCNE and TCNQ and wherein the composition comprises one of $V[TCNE]_x$ and $V[TCNQ]_x$ and wherein x ranges from approximately 1.35 to approximately 2.0.

16. The thin film magnet of claim 10, wherein the organic compound comprises TCNE and wherein the composition comprises $V[TCNE]_x$ and wherein x ranges from approximately 1.35 to approximately 2.0.

17. The thin film magnet of claim 10, wherein the organic compound comprises TCNQ and wherein the composition comprises and $V[TCNQ]_x$ and wherein x ranges from approximately 1.35 to approximately 2.0.

18. The thin film magnet of claim 1, wherein the gas reaction was conducted at a process pressure of less than approximately 50 Torr.

19. The thin film magnet of claim 18, wherein the gas reaction was conducted at a process pressure in a range of approximately 5 Torr to 15 Torr.

20. The thin film magnet of claim 18, wherein the thin film has as a thickness less than approximately 10 $\mu$m.

21. The thin film magnet of claim 1, wherein the gas reaction was conducted in the presence of a gas selected from the group consisting of argon, helium, nitrogen, or any of the noble gases.

22. The thin film magnet of claim 1, wherein the gas reaction was conducted in the presence of $CO_2$ gas.

23. The thin film magnet of claim 1, wherein the gas reaction was conducted at process temperatures less than approximately 90° C.

24. The thin film magnet of claim 23, wherein the gas reaction was conducted at a process temperature in a range of approximately 40° C. to approximately 70° C.

25. A process of depositing a magnetic thin film upon a substrate by chemical vapor deposition in the absence of a solvent, the process comprising:
   providing a temperature and pressure controlled reaction chamber;
   providing a substrate within the reaction chamber;
   introducing a selected quantity of TCNE within the reaction chamber;
   providing a supply of a vanadium-containing compound in communication with the reaction chamber;
   introducing at least one inert or noble gas into the reaction chamber within a selected flow rate range;
   introducing a controlled amount of the vanadium-containing compound into the reaction chamber to react with the TCNE; and
   allowing the vanadium-containing compound and the TCNE to react within a selected process temperature range and within a selected process pressure range until a magnetic thin film within a selected range of thickness has been disposed upon the substrate.

26. The process of claim 25, wherein providing a supply of vanadium-containing compound comprises providing at least one of the group consisting of vanadium hexcarbonyl and bis(benzenevanadium).

27. The process of claim 25, wherein introducing a selected quantity of TCNE and introducing a controlled amount of a vanadium-containing compound comprises each being introduced at a respective amount to render a magnetic thin film comprising $V[TCNE]_x$ wherein x ranges between 1.35 and 2.0.

28. The process of claim 27, wherein introducing a selected quantity of TCNE and introducing a controlled amount of vanadium-containing compound comprises each being introduced at a respective amount to render a magnetic thin film comprising $V[TCNE]_x$ wherein x ranges from between 1.5 and 1.8.

29. The process of claim 27, wherein introducing a selected quantity of TCNQ and introducing a controlled amount of vanadium-containing compound comprises each being introduced at a respective amount to render a magnetic thin film comprising $V[TCNQ]_x$ wherein x ranges from between 1.5 and 1.8.

30. The process of claim 25, wherein providing a substrate within the reaction chamber comprises providing a substrate comprising at least one of the group consisting of a glass, a quartz, mica, a glass-ceramic, a ceramic, a metal, a metal alloy, alkali halide, alkaline halide, metal, alloys, intermetallic materials, magnetically hard material, magnetically soft material, aluminum-nickel, cobalt, polytetrafluorethylene, a nylon, a synthetic polymer, a natural polymer and semiconductor material.

31. The process of claim 25, wherein providing a temperature and pressure controlled reaction chamber comprises providing a chemical vapor deposition apparatus comprising providing a first metering valve for introducing the inert or noble gas to a first side of the apparatus, providing a second metering valve for introducing the at least one inert or noble gas to a second side of the apparatus, providing a heating device about the temperature and pressure controlled reaction chamber, and providing a process pressure monitoring device.

32. The process of claim 25, wherein allowing the vanadium-containing compound and the TCNE to react within a selected temperature range comprises maintaining the process temperature within a range of approximately 25° C. to approximately 90° C.

33. The process of claim 25, wherein allowing the vanadium-containing compound and the TCNE to react within a selected process pressure range comprises maintaining the process pressure within a range of approximately 1 Torr to approximately 50 Torr.

34. The process of claim 25, wherein introducing a controlled amount of the vanadium-containing compound into the reaction chamber comprises controlling the temperature at which the vanadium-containing compound is introduced into the reaction chamber within a selected temperature range.

35. The process of claim 34, wherein controlling the temperature at which the vanadium-containing compound is introduced into the reaction chamber is maintained within a range of approximately 10° C. to approximately 25° C.

36. The process of claim 25, wherein the process is conducted in the absence of solvents consisting of one of the group of acetonitrile, tetrahydrofuran, or dichloromethane.

37. The process of claim 25, wherein allowing the vanadium-containing compound and the TCNE to react within a selected temperature range and within a preselected pressure range until a magnetic thin film of a selected thickness has been deposited upon the substrate comprises depositing a magnetic thin film having a thickness not exceeding approximately 25 $\mu$m.

38. The process of claim 37, wherein allowing the vanadium-containing compound and the TCNE to react within a selected temperature range and within a preselected pressure range until a magnetic thin film of a selected thickness has been deposited upon the substrate comprises depositing a magnetic thin film having a thickness in a range of approximately 2 nm to approximately 10 $\mu$m.

39. The process of claim 25, wherein introducing at least one of a inert gas and a noble gas into the reaction chamber within a selected flow rate range comprises introducing at least one of nitrogen, hydrogen, helium, neon, argon, krypton, xenon, and radon.

40. The process of claim 39, wherein introducing at least one inert or noble gas into the reaction chamber within a selected flow rate range comprises introducing one of at least one inert gas and noble gas into the reaction chamber from more than one position.

41. The process of claim 40, wherein introducing a quantity of TCNE into the reaction chamber comprises controlling the flow rate at the first position in which one of the at least one inert gas and noble gas is introduced into the reaction chamber.

42. The process of claim 40, wherein introducing at least one inert or noble gas into the reaction chamber from more than one position comprises introducing one of at least one inert gas and noble gas into the reaction chamber from a first position and from at least one other position at an individually controlled rate for each position.

43. The process of claim 40 wherein introducing one of at least one inert gas and noble gas into the reaction chamber from more than one position at an individually controlled rate comprises maintaining the flow rate at the first position within a first flow rate range to influence the reaction of the TCNE and the vanadium-containing compound and maintaining the flow rate at the at least one other position within a second flow rate range to influence the reaction of the TCNE and the vanadium-containing compound.

44. The process of claim 40, wherein maintaining the flow rate at the first position and maintaining the flow rate at the at least one other position comprises maintaining the flow rate at the first position at a rate of approximately 2 to 3 times the flow rate at the at least one second position.

45. The process of claim 40 wherein introducing the vanadium-containing compound into the reaction chamber is comprises controlling the flow rate at the least one other position in which one of at least one inert gas and noble gas is introduced into the reaction chamber.

46. The process of claim 25, wherein introducing at least one of a inert gas and a noble gas into the reaction chamber within a selected flow rate range comprises introducing at least one of carbon dioxide.

47. The process of claim 25, wherein introducing a quantity of TCNE into the reaction chamber comprises introducing a selected quantity of TCNE in crystalline form.

48. The process of claim 25, further comprising annealing the magnetic thin film at a temperature within a range from approximately 25° C. to approximately 90° C. for a period of time from approximately twenty minutes to approximately twelve hours.

* * * * *

UNITED STATES PATENT AND TRADEMARK OFFICE
CERTIFICATE OF CORRECTION

| | |
|---|---|
| PATENT NO. | : 6,660,375 B1 |
| APPLICATION NO. | : 10/089480 |
| DATED | : December 9, 2003 |
| INVENTOR(S) | : Joel S. Miller et al. |

It is certified that error appears in the above-identified patent and that said Letters Patent is hereby corrected as shown below:

Col. 1, line 5 please add the following Statement:

--This invention was made with government support under Grants #DE-FG03-93ER45504, #DE-FG02-96ER12198, and #DE-FG02-86BR45271 awarded by the Department of Energy. The Government has certain rights to this invention.--

Signed and Sealed this

Thirty-first Day of March, 2009

JOHN DOLL
*Acting Director of the United States Patent and Trademark Office*